United States Patent
Loy et al.

(10) Patent No.: US 11,476,303 B2
(45) Date of Patent: Oct. 18, 2022

(54) MULTI-LEVEL CELL CONFIGURATIONS FOR NON-VOLATILE MEMORY ELEMENTS IN A BITCELL

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 54 days.

(21) Appl. No.: 17/111,996

(22) Filed: Dec. 4, 2020

(65) Prior Publication Data
US 2022/0181387 A1 Jun. 9, 2022

(51) Int. Cl.
*H01L 27/24* (2006.01)
*H01L 45/00* (2006.01)

(52) U.S. Cl.
CPC ...... *H01L 27/2436* (2013.01); *H01L 45/1675* (2013.01)

(58) Field of Classification Search
CPC ........................ H01L 27/2436; H01L 45/1675
See application file for complete search history.

(56) References Cited

U.S. PATENT DOCUMENTS

| 2015/0357376 A1* | 12/2015 | Seo | H01L 43/02 |
| | | | 257/421 |
| 2021/0043827 A1* | 2/2021 | Hashemi | H01L 43/08 |
| 2021/0399046 A1* | 12/2021 | Wu | H01L 43/02 |

OTHER PUBLICATIONS

Linn et al., "Compact modeling of CRS devices based on ECM cells for memory, logic and neuromorphic applications", Nanotechnology, vol. 24, No. 38, Published Sep. 2, 2013.
Khurana, G., Kumar, N., Chhowalla, M. et al. "Non-Polar and Complementary Resistive Switching Characteristics in Graphene Oxide devices with Gold Nanoparticles: Diverse Approach for Device Fabrication" b Sci Rep 9, 15103 (2019).
Desmond Jia Jun Loy et al., "Non-Volatile Memory Elements With a Multi-Level Cell Configuration", filed Jun. 9, 2020 as U.S. Appl. No. 16/896,788.
Schönhals et al., "3-bit Resistive RAM Write-Read Scheme Based on Complementary Switching Mechanism", IEEE Electron Device Letters, vol. 38, No. 4, Apr. 2017.
C. Chou et al., "An N40 256K×44 embedded RRAM macro with SL precharge SA and low-voltage current limiter to improve read and write performance," 2018 IEEE International Solid-State Circuits Conference—(ISSCC), San Francisco, CA, 2018, pp. 478-480.

(Continued)

*Primary Examiner* — Latanya N Crawford Eason
(74) *Attorney, Agent, or Firm* — Thompson Hine LLP (57) ABSTRACT

Structures including non-volatile memory elements and methods of fabricating a structure including non-volatile memory elements. First, second, and third non-volatile memory elements each include a first electrode, a second electrode, and a switching layer between the first electrode and the second electrode. A first bit line is coupled to the first electrode of the first non-volatile memory element and to the first electrode of the second non-volatile memory element. A second bit line is coupled to the first electrode of the third non-volatile memory element.

20 Claims, 4 Drawing Sheets

(56) References Cited

OTHER PUBLICATIONS

M. Tada et al., "Highly reliable, complementary atom switch (CAS) with low programming voltage embedded in Cu BEOL for Non-volatile Programmable Logic," 2011 International Electron Devices Meeting, Washington, DC, 2011, pp. 30.2.1-30.2.4.

Linn, E., Rosezin, R., Kügeler, C. et al., "Complementary resistive switches for passive nanocrossbar memories", Nature Mater 9, 403-406 (2010).

\* cited by examiner

FIG. 4

MULTI-LEVEL CELL CONFIGURATIONS FOR NON-VOLATILE MEMORY ELEMENTS IN A BITCELL

BACKGROUND

The present invention relates to integrated circuits and semiconductor device fabrication and, more specifically, to structures including non-volatile memory elements and methods of fabricating a structure including non-volatile memory elements.

A resistive random-access memory (ReRAM or RRAM) device provides one type of embedded non-volatile memory technology. Because its memory elements are non-volatile, the stored data is retained by the resistive random-access memory device when the memory elements are not powered. The non-volatility of a resistive random-access memory device contrasts with volatile memory technologies, such as a dynamic random-access memory (DRAM) device in which the stored data is lost if not periodically refreshed a static random-access memory and a (SRAM) device in which the stored data is eventually lost when unpowered.

Data is stored in a memory element of each bitcell of a resistive random-access memory device by changing the resistance across a switching layer to provide different resistance states, namely a high-resistance state and a low-resistance state. The switching layer can be written in the low-resistance state by applying a bias voltage sufficient to form one or more filaments defining conductive paths bridging across the thickness of the switching layer. The filaments can be destroyed, also by the application of a bias voltage across the switching layer, to write the high-resistance state.

Improved structures including non-volatile memory elements and methods of fabricating a structure including non-volatile memory elements are needed.

SUMMARY

According to an embodiment of the invention, a structure includes a first non-volatile memory element having a first electrode, a second electrode, and a switching layer between the first electrode and the second electrode, a second non-volatile memory element having a first electrode, a second electrode, and a switching layer between the first electrode and the second electrode, and a third non-volatile memory element having a first electrode, a second electrode, and a switching layer between the first electrode and the second electrode. A first bit line is coupled to the first electrode of the first non-volatile memory element and to the first electrode of the second non-volatile memory element. A second bit line is coupled to the first electrode of the third non-volatile memory element.

According to another embodiment of the invention, a method includes forming a first non-volatile memory element including a first electrode, a second electrode, and a switching layer between the first electrode and the second electrode, forming a second non-volatile memory element including a first electrode, a second electrode, and a switching layer between the first electrode and the second electrode, and forming a third non-volatile memory element including a first electrode, a second electrode, and a switching layer between the first electrode and the second electrode. The method further includes forming a first bit line coupled to the first electrode of the first non-volatile memory element and to the first electrode of the second non-volatile memory element, and forming a second bit line coupled to the first electrode of the third non-volatile memory element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
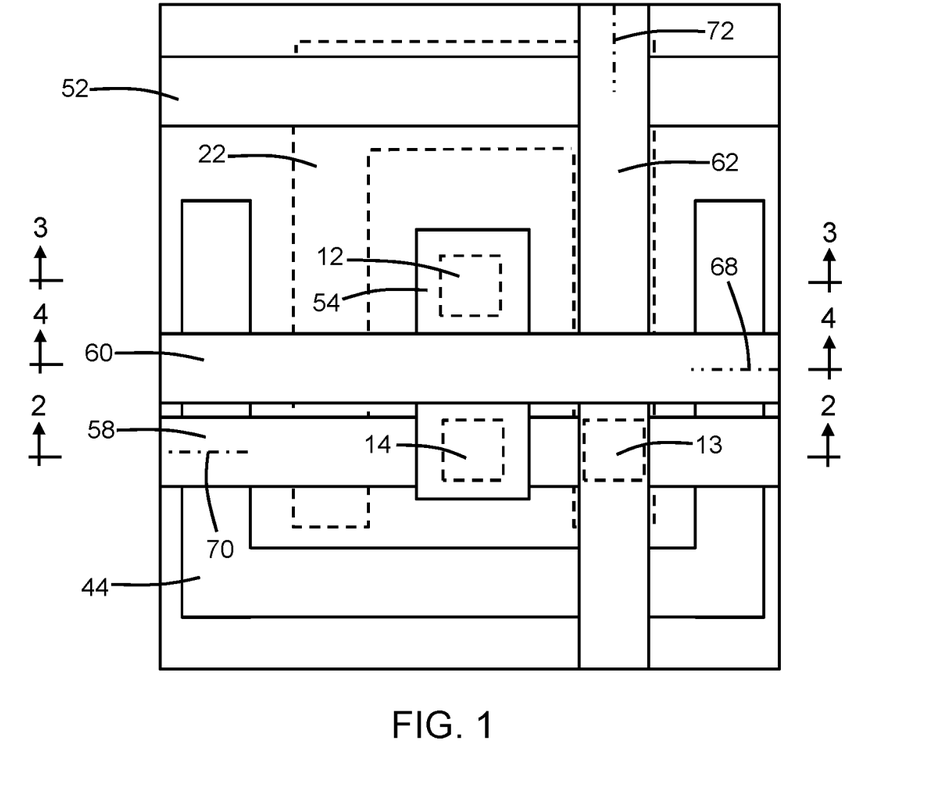
FIG. 1 is a diagrammatic top view of a structure for a multi-bit, multi-level bitcell in accordance with embodiments of the invention.
Figure 2:
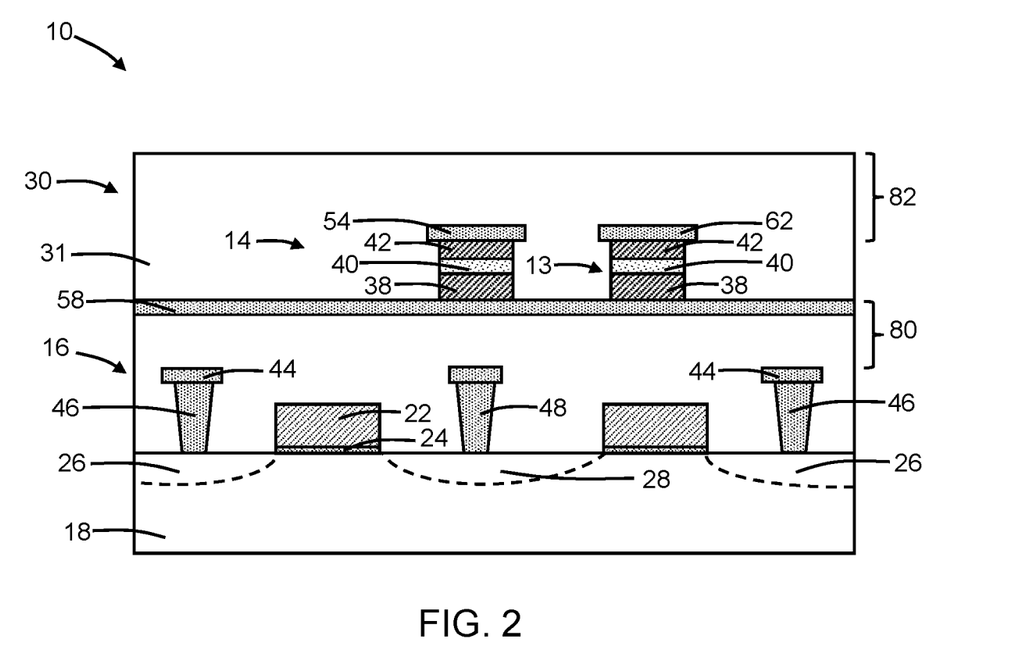
FIG. 2 is a cross-sectional view taken generally along line 2-2 in FIG. 1.
Figure 3:
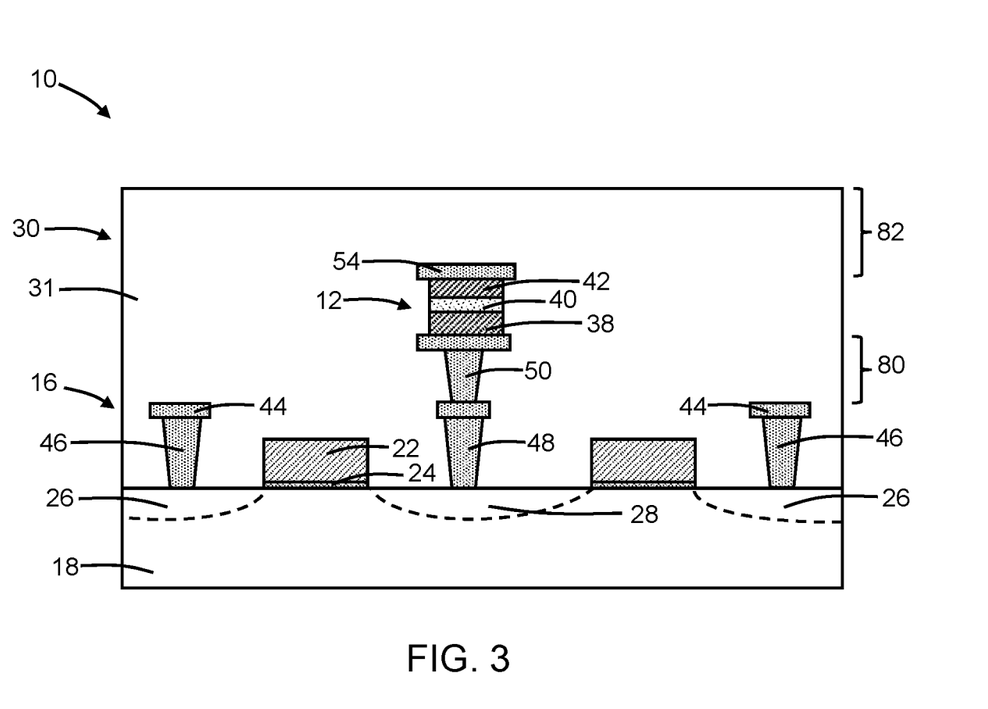
FIG. 3 is a cross-sectional view taken generally along line 3-3 in FIG. 1.
Figure 4:
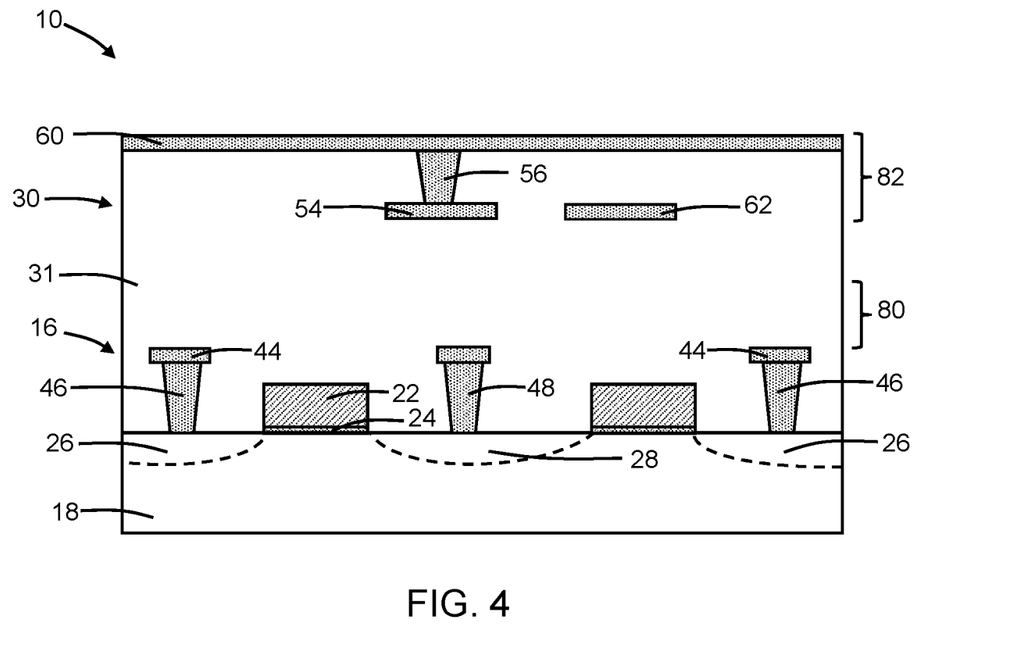
FIG. 4 is a cross-sectional view taken generally along line 4-4 in FIG. 1.

With reference to FIGS. 1-4 and in accordance with embodiments of the invention, a structure 10 for a multi-bit, multi-level bitcell includes a non-volatile memory element 12, a non-volatile memory element 13, a non-volatile memory element 14, and a field-effect transistor 16. The field-effect transistor 16 may be fabricated by complementary metal-oxide semiconductor processing using a substrate 18 that contains a semiconductor material, such as single-crystal silicon. The structure 10 may be part of a memory array that includes multiple bitcells each substantially similar or identical to the structure 10.

The field-effect transistor 16 may include a gate electrode 22, a gate dielectric layer 24, a source region 26, and a drain region 28. The gate electrode 22 may be comprised of heavily-doped polysilicon that is deposited as a blanket layer over the substrate 18 and patterned with lithography and etching processes, and the gate dielectric layer 24 may be comprised of silicon dioxide that is deposited and patterned when the gate electrode 22 is patterned. Alternatively, the gate electrode 22 may be a metal gate formed by a gate-first process or a replacement gate process, and the gate dielectric layer 24 may be comprised of a high-k dielectric material. The gate electrode 22 may include multiple fingers that are interconnected with each other at one end. The source region 26 and drain region 28 may be doped portions of the substrate 18. The source region 26 and drain region 28 may be doped with an n-type dopant (e.g., phosphorus and/or arsenic) that provides n-type electrical conductivity or, alternatively, the source region 26 and drain region 28 may be doped with a p-type dopant (e.g., boron) that provides p-type electrical conductivity.

An interconnect structure 30 may be formed by middle-of-line processing and back-end-of-line processing over the field-effect transistor 16 and substrate 18. The interconnect structure 30 includes metallization levels with interlayer dielectric layers 31 and metal features disposed in the interlayer dielectric layers 31. The interlayer dielectric layers 31 may be comprised of a dielectric material, such as carbon-doped silicon dioxide. Conductive features in the different interlayer dielectric layers 31 of the interconnect structure 30 connect the field-effect transistor 16 with the non-volatile memory element 14 and provide the connections for the lines used to read data from, and write data to, the structure 10.

The non-volatile memory elements 12, 13, 14 are arranged in a plane of the structure 10 that is located between a metallization level 80 and one or more metallization levels 82 of the interconnect structure 30. The non-volatile memory elements 12, 14 have a juxtaposed arrangement in a horizontal direction within the plane, and the non-volatile memory elements 12, 13 also have a juxtaposed arrangement in a different horizontal direction within the plane. The non-volatile memory elements 12, 13, 14 are not stacked in the vertical direction within different planes in the interconnect structure 30.

In an embodiment, the non-volatile memory elements 12, 13, 14 may be constructed as resistive memory elements that include a bottom electrode 38, a switching layer 40 located on the bottom electrode 38, and a top electrode 42 located on the switching layer 40. The switching layer 40 is positioned in a vertical direction between the bottom electrode 38 and the top electrode 42. The bottom electrode 38 may be comprised of a metal, such as ruthenium, platinum, titanium nitride, or tantalum nitride. The switching layer 40 may be comprised of a dielectric material, such as silicon dioxide, silicon nitride, or a metal oxide (e.g., magnesium oxide, tantalum oxide, hafnium oxide, titanium oxide, or aluminum oxide). The top electrode 42 may be comprised of a metal, such as tantalum, hafnium, titanium, copper, silver, cobalt or tungsten. The bottom electrode 38, switching layer 40, and the top electrode 42 of each of the non-volatile memory elements 12, 13, 14 may be concurrently formed by shared lithography and etching processes that shape a deposited layer stack of their constituent materials.

Data is stored in the structure 10 by changing the individual electrical resistances of the switching layers 40 of the non-volatile memory elements 12, 13, 14 through the application of bias voltages to provide different aggregate levels of resistance. The electrical resistance of the switching layer 40 can be reduced by applying a bias voltage across the switching layer 40 to create one or more filaments or conductive paths that bridge between the electrodes 38, 42. The electrical resistance of the dielectric material can be increased by applying a bias voltage across the switching layer 40 to destroy the filaments. In that regard, filaments are created in order to write the low-resistance state of each of the non-volatile memory elements 12, 13, 14, and filaments are destroyed in order to write the high-resistance state of each of the non-volatile memory elements 12, 13, 14.

In combination, the low-resistance states and the high-resistance states of the non-volatile memory elements 12, 13, 14 may be used to store data in multiple levels (e.g., eight state combinations). In an embodiment, the non-volatile memory elements 12, 13, 14 may have nominally equal sizes such that their resistance values in the high-resistance state are approximately equal and their resistance values in the low-resistance state are approximately equal. In an embodiment, at least two of the non-volatile memory elements 12, 13, 14 may have different sizes such that their resistance values in the high-resistance state differ and their resistance values in the low-resistance state differ, which may increase the number of state combinations available as levels for the structure 10.

The interconnect structure 30 includes a select line 44 that is physically and electrically connected (i.e., coupled) by one or more source contacts 46 with the source region 26 of the field-effect transistor 16. The interconnect structure 30 also include one or more drain contacts 48, metal islands, and one or more vias 50 that physically and electrically connect (i.e., couple) the drain region 28 of the field-effect transistor 16 with the bottom electrode 38 of the non-volatile memory element 12. A word line 52 is coupled by one or more vias (not shown) to the gate electrode 22 of the field-effect transistor 16.

A bit line strap 54 is physically and electrically connected (i.e., coupled) to the top electrode 42 of the non-volatile memory element 12 and also physically and electrically connected (i.e., coupled) to the top electrode 42 of the non-volatile memory element 14. The bit line strap 54 is physically and electrically connected (i.e., coupled) by one or more vias 56 to a bit line 60. In this manner, the bit line strap 54 commonly connects the bit line 60 with the top electrode 42 of the non-volatile memory element 12 and the top electrode 42 of the non-volatile memory element 14.

A bit line 58 is physically and electrically connected (i.e., coupled) to the bottom electrode 38 of the non-volatile memory element 13 and also to the bottom electrode 38 of the non-volatile memory element 14. In an embodiment, the bit line 58 may be directly coupled to the bottom electrode 38 of the non-volatile memory element 13 and directly coupled to the bottom electrode 38 of the non-volatile memory element 14. A bit line 62 is physically and electrically connected (i.e., coupled) to the top electrode 42 of the non-volatile memory element 13. In an embodiment, the bit line 62 may be directly coupled to the top electrode 42 of the non-volatile memory element 13.

The bit line 58 and the bit line 62 control access to the non-volatile memory element 13, and the bit line 58 and the bit line 60 control access to the non-volatile memory elements 12, 14. The bit line 58 is positioned in a vertical direction below the non-volatile memory elements 12, 13, 14, and the bit line strap 54 and the bit lines 60, 62 are positioned in a vertical direction above the non-volatile memory elements 12, 13, 14. The bit line 60 is aligned parallel, or substantially parallel, to the bit line 58, and the bit line 60 is positioned in a vertical direction above the bit line 58 and above the bit line 62. The non-volatile memory element 12 overlaps with a portion of the bit line 58. However, the non-volatile memory element 14 is laterally offset (i.e., horizontally offset) from the bit line 58. The bit line 62, which is positioned in a vertical direction between the bit line 58 and the bit line 60, is only coupled to the top electrode 42 of the non-volatile memory element 13 and is not coupled to either of the non-volatile memory elements 12, 14. The bit line 62 is arranged in the same metallization level 82 as the bit line strap 54, but is laterally offset (i.e., horizontally offset) from the bit line strap 54. The horizontal direction of the offset of the bit line 62 relative to the bit line strap 54 may be transverse to the horizontal direction of the offset of the non-volatile memory element 14 relative to the bit line 58. The non-volatile memory elements 12, 13, 14, the bit line strap 54, and the bit line 62 are positioned in a vertical direction between the bit line 58 and the bit line 60. The non-volatile memory element 13 is positioned in a vertical direction between the bit line 60 and the bit line 62.

A portion of the bit line 62 overlaps with the non-volatile memory element 13, and the non-volatile memory element 13 overlaps with a portion of the bit line 58. The bit line 58 is positioned below the bit line 62 and is aligned transverse to the bit line 62. In the latter regard, the bit line 58 includes a longitudinal axis 68 and the bit line 62 includes a longitudinal axis 72 that is aligned transverse to the longitudinal axis 68. The non-volatile memory elements 12, 14 have a spaced arrangement along the longitudinal axis 68 of the bit line 58. The bit line 60 is positioned above the bit line 62 and is aligned transverse to the bit line 62. In the latter regard, the bit line 60 includes a longitudinal axis 70 that is aligned transverse to the longitudinal axis 72 of the bit line 62.

The source contacts 46 and drain contacts 48 may be formed in contact openings defined by lithography and etching in one or more of the interlayer dielectric layers 31. The source contacts 46 and drain contacts 48 may include a lower portion containing a metal silicide, such as tungsten silicide, titanium silicide, nickel silicide, or cobalt silicide, formed by silicidation, and an upper portion containing a metal, such as tungsten, that is deposited by chemical vapor deposition and planarized. The select line 44, the vias 50, the word line 52, the bit line strap 54, the bit lines 58, 60, 62, and the metal islands may be formed by a damascene process that patterns trenches in one or more of the interlayer dielectric layers 31 and fills the trenches with a conductor, such as copper.

In use, the non-volatile memory elements 12, 14 may both be written from high-resistance states to low-resistance states by a set operation in an initial step of a two-step process. One or both, or neither, of the non-volatile memory elements 12, 14 may be subsequently written from the low-resistance state to a high-resistance state by a reset operation to provide multiple levels with different state combinations. In a subsequent step of the two-step process, the non-volatile memory element 13 may then be read and, if needed, separately switched by set and reset operations to write either a high-resistance state or a low-resistance state, which provides a mechanism to provide additional multiple levels with different state combinations. In an alternative order for the two-step process, the non-volatile memory element 13 may be read and, if needed, written, followed by a subsequent step of writing the non-volatile memory elements 12, 14. The combination of the non-volatile memory elements 12, 13, 14 may be placed in multiple levels characterized by different state combinations in which the non-volatile memory elements 12, 13, 14 have different combinations of low-resistance and high-resistance states. The structure 10 is therefore capable of being programmed in any of these multiple levels. The bit lines 60, 62 provide additional biasing mechanisms to control the two-step process providing the different state combinations of the multiple levels.

In an alternative embodiment, the non-volatile memory elements 12, 13, 14 may be phase-change material (PCM) memory elements in which the switching layer 40 contains a phase-change material, such as a chalcogenide glass (e.g., $Ge_2Sb_2Te_5$). The phase-change material may be heated above a transition temperature and cooled to provide either an amorphous phase or a crystalline phase that respectively define the high-resistance and low-resistance states. More specifically, the phase-change material may be heated by applying an electrical current that is sufficient to elevate the temperature of the switching layer 40 above the transition temperature, and then allowed to cool to a temperature less than the transition temperature to cause a state change. For example, the state change of the phase-change material to either the amorphous phase or the crystalline phase may be contingent upon, for example, the cooling rate.

In an alternative embodiment, the non-volatile memory elements 12, 13, 14 may be ferroelectric memory elements that include a ferroelectric material as the switching layer 40. The ferroelectric material of the switching layer 40 may comprise, for example, lead zirconate titanate (PZT).

In an alternative embodiment, the non-volatile memory elements 12, 13, 14 may be magnetic-tunnel-junction memory elements. In that regard, each of the non-volatile memory elements 12, 13, 14 may include a pinned or fixed layer, a tunnel barrier layer, and a free layer that are arranged in a layer stack between the bottom and top electrodes 38, 42. The fixed layer may include one or more layers, such as a reference layer and a hard layer, that are comprised of a magnetic material, such as a cobalt-platinum alloy or a cobalt-iron-boron alloy. The tunnel barrier layer may be comprised of a non-magnetic, dielectric material, such as magnesium oxide or aluminum oxide. The free layer, which provides the switching layer 40, may include one or more layers comprised of a magnetic alloy, such as a cobalt-iron-boron alloy. The magnetization of the reference layer of the fixed layer is pinned such that the magnetization vector cannot flip (i.e., rotate) under the influence of a programming current. The magnetization of the free layer is not pinned such that the magnetization vector can flip (i.e., rotate) under the influence of a programming current.

The field-effect transistor 16 and non-volatile memory elements 12, 13, 14 have a 1T3R (one-transistor, three-resistor) multi-level cell (MLC) configuration capable of storing multiple bits in a single bitcell, which may lead to improvements in density and a reduction in the cost-per-bit in comparison with conventional non-volatile memory bitcells. The non-volatile memory elements 12, 13, 14 may be shaped by the same lithography and etching processes, which promotes efficient fabrication.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a first non-volatile memory element including a first electrode, a second electrode, and a switching layer between the first electrode and the second electrode;
   a second non-volatile memory element including a first electrode, a second electrode, and a switching layer between the first electrode and the second electrode;
   a third non-volatile memory element including a first electrode, a second electrode, and a switching layer between the first electrode and the second electrode;
   a first bit line coupled to the first electrode of the first non-volatile memory element and to the first electrode of the second non-volatile memory element;
   a second bit line coupled to the first electrode of the third non-volatile memory element; and
   a third bit line coupled to the second electrode of the first non-volatile memory element and to the second electrode of the third non-volatile memory element.

2. The structure of claim 1 wherein the first bit line includes a first longitudinal axis, the second bit line includes a second longitudinal axis that is aligned transverse to the first longitudinal axis of the first bit line, and the third bit line includes a third longitudinal axis that is aligned parallel to the first longitudinal axis of the first bit line.

3. The structure of claim 1 wherein the third non-volatile memory element is positioned in a vertical direction between the second bit line and the third bit line.

4. The structure of claim 3 wherein the first non-volatile memory element is positioned in the vertical direction between the first bit line and the third bit line.

5. The structure of claim 1 further comprising:
   a bit line strap coupled to the first electrode of the first non-volatile memory element and the first electrode of the second non-volatile memory element,
   wherein the first bit line is coupled by the bit line strap to the first electrode of the first non-volatile memory element and the first electrode of the second non-volatile memory element.

6. The structure of claim 1 further comprising:
   a field-effect transistor including a drain,
   wherein the drain of the field-effect transistor is coupled to the second electrode of the second non-volatile memory element.

7. The structure of claim 1 wherein the first non-volatile memory element and the third non-volatile memory element have a juxtaposed arrangement over the third bit line, and the first non-volatile memory element and the third non-volatile memory element are arranged with a lateral offset relative to the second bit line.

8. The structure of claim 1 wherein the third bit line is directly coupled to the second electrode of the first non-volatile memory element and to the second electrode of the third non-volatile memory element.

9. The structure of claim 1 wherein the first non-volatile memory element and the third non-volatile memory element are spaced along a longitudinal axis of the third bit line.

10. The structure of claim 1 wherein the switching layer of the first non-volatile memory element and the switching layer of the second non-volatile memory element each comprise a dielectric material.

11. The structure of claim 1 wherein the switching layer of the first non-volatile memory element and the switching layer of the second non-volatile memory element each comprise a phase change material.

12. The structure of claim 1 wherein the switching layer of the first non-volatile memory element and the switching layer of the second non-volatile memory element each comprise a ferroelectric material.

13. The structure of claim 1 wherein the first bit line includes a first longitudinal axis, and the second bit line includes a second longitudinal axis that is aligned transverse to the first longitudinal axis of the first bit line.

14. A structure of claim 1 comprising:
   a first non-volatile memory element including a first electrode, a second electrode, and a switching layer between the first electrode and the second electrode;
   a second non-volatile memory element including a first electrode, a second electrode, and a switching layer between the first electrode and the second electrode;
   a third non-volatile memory element including a first electrode, a second electrode, and a switching layer between the first electrode and the second electrode;
   a first bit line coupled to the first electrode of the first non-volatile memory element and to the first electrode of the second non-volatile memory element, the first bit line including a first longitudinal axis; and
   a second bit line coupled to the first electrode of the third non-volatile memory element, the second bit line including a second longitudinal axis,
   wherein the second longitudinal axis of the second bit line is aligned transverse to the first longitudinal axis of the first bit line.

15. The structure of claim 14 further comprising:
   a bit line strap coupled to the first electrode of the first non-volatile memory element and the first electrode of the second non-volatile memory element,
   wherein the first bit line is coupled by the bit line strap to the first electrode of the first non-volatile memory element and the first electrode of the second non-volatile memory element.

16. A method comprising:
   forming a first non-volatile memory element including a first electrode, a second electrode, and a switching layer between the first electrode and the second electrode;
   forming a second non-volatile memory element including a first electrode, a second electrode, and a switching layer between the first electrode and the second electrode;
   forming a third non-volatile memory element including a first electrode, a second electrode, and a switching layer between the first electrode and the second electrode;
   forming a first bit line coupled to the first electrode of the first non-volatile memory element and to the first electrode of the second non-volatile memory element;
   forming a second bit line coupled to the first electrode of the third non-volatile memory element; and forming a third bit line coupled to the second electrode of the first non-volatile memory element and to the second electrode of the third non-volatile memory element.

17. The method of claim 16 wherein the first non-volatile memory element, the second non-volatile memory element, and the third non-volatile memory element are concurrently formed by lithography and etching processes.

18. The method of claim 16 wherein the first bit line includes a first longitudinal axis, the second bit line includes a second longitudinal axis that is aligned transverse to the first longitudinal axis of the first bit line, and the third bit line includes a third longitudinal axis that is aligned parallel to the first longitudinal axis of the first bit line.

19. The method of claim 16 wherein the third non-volatile memory element is positioned in a vertical direction between the second bit line and the third bit line, and the first non-volatile memory element is positioned in the vertical direction between the first bit line and the third bit line.

20. The method of claim 16 wherein the first bit line includes a first longitudinal axis, and the second bit line includes a second longitudinal axis that is aligned transverse to the first longitudinal axis of the first bit line.

\* \* \* \* \*

UNITED STATES PATENT AND TRADEMARK OFFICE
CERTIFICATE OF CORRECTION

| | | |
|---|---|---|
| PATENT NO. | : 11,476,303 B2 | Page 1 of 1 |
| APPLICATION NO. | : 17/111996 | |
| DATED | : October 18, 2022 | |
| INVENTOR(S) | : Desmond Jia Jun Loy, Eng Huat Toh and Shyue Seng Tan | |

It is certified that error appears in the above-identified patent and that said Letters Patent is hereby corrected as shown below:

In the Claims

Column 8, Claim 14, Line 23 reads:
"14. A structure of claim 1 comprising:"
Should read:
--14. A structure comprising:--

Signed and Sealed this
Fifteenth Day of November, 2022

*Katherine Kelly Vidal*

Katherine Kelly Vidal
*Director of the United States Patent and Trademark Office*